United States Patent [19]

Carver

[11] Patent Number: 4,586,002

[45] Date of Patent: Apr. 29, 1986

[54] AUDIO AMPLIFYING APPARATUS AND METHOD

[76] Inventor: Robert W. Carver, 330 Ave. A, Snohomish, Wash. 98290

[21] Appl. No.: 616,398

[22] Filed: Jun. 1, 1984

Related U.S. Application Data

[63] Continuation-in-part of Ser. No. 413,876, Sep. 1, 1982, Pat. No. 4,484,150, which is a continuation of Ser. No. 261,238, filed as PCT US79/00952, Nov. 11, 1979, published as WO80/01023, May 15, 1980, § 102(e) date Jun. 27, 1980, abandoned, which is a continuation-in-part of Ser. No. 27,471, Apr. 5, 1979, abandoned, and Ser. No. 958,141, Nov. 6, 1978, Pat. No. 4,218,660.

[51] Int. Cl.⁴ ............................................. H03F 3/30
[52] U.S. Cl. ..................................... 330/297; 330/267
[58] Field of Search ............... 330/263, 267, 273, 296, 330/297; 323/282, 320, 325; 363/21, 86, 89

[56] References Cited

U.S. PATENT DOCUMENTS

| | | | |
|---|---|---|---|
| 3,466,527 | 9/1969 | Chun | 363/52 |
| 3,506,905 | 4/1970 | Thomas | |
| 4,051,425 | 9/1977 | Smith | 363/86 |
| 4,321,662 | 3/1982 | Yokoyama | 363/86 |

FOREIGN PATENT DOCUMENTS 141743  5/1974 Japan .
 44857  4/1976 Japan .
119149 10/1977 Japan .
119150 10/1977 Japan .

OTHER PUBLICATIONS

Walker, "SCR Power Supplies", *Electronics World*, Oct. 1971, pp. 36–38, 62.

*Primary Examiner*—James B. Mullins
*Attorney, Agent, or Firm*—Hughes & Cassidy

[57] ABSTRACT

An audio amplifier operatively connected to the secondary winding of a power transformer. The primary winding of the transformer is connected through a control circuit which has switch means that is turned on and off during selected portions of half cycles of the voltage imposed upon the primary winding of the transformer. By turning the switch on and off at appropriate intervals, the proper amounts of electrical energy can be delivered to supply the power requirements for amplification, while substantially reducing problems of idling currents in the primary winding of the transformer. Thus, the transformer can be made much smaller than in power supplies of conventional amplifiers.

20 Claims, 12 Drawing Figures

AUDIO AMPLIFYING APPARATUS AND METHOD

CROSS REFERENCE TO RELATED APPLICATIONS

This application is a continuation-in-part of U.S. Pat. application Ser. No. 413,876, filed Sept. 1, 1982, and now issued as U.S. Pat. No. 4,484,150, which is in turn a continuation application of U.S. application Ser. No. 261,238, filed as PCT US. 79/00952 on Nov. 11, 1979, published as WO 80/01023 on May 15, 1980, § 102(e) date June 27, 1980, and now abandoned, which in turn was converted from a PCT application, US. 79/00952, filed Nov. 6, 1979, which in turn was a continuation-in-part of, and claimed the priority dates of, the following two applications, namely, Ser. No. 27,471 filed Apr. 5, 1979 and now abandoned, and Ser. No. 958,141, filed Nov. 6, 1978, and now issued as U.S. Pat. No. 4,218,660, on Aug. 19, 1980.

TECHNICAL FIELD

This invention relates to a method and apparatus for audio signal amplification, audio amplifier circuitry, and power supplies therefor.

BACKGROUND ART

Solid state circuit components have brought incredible reduction in the size, weight and cost of audio amplifier circuitry and have also achieved increased fidelity in sound reproduction as compared with vaccuum tube technology of a prior generation. In an attempt to exploit to the limit the potential of solid state circuitry, audio engineers have striven to provide the user with increased power ratings while simultaneously achieving decreased distortion levels. Their efforts have met with resounding success, but have produced some undesirable side effects primarily in the areas of increased weight, cost and power consumption. For example, a commercially available state-of-the-art 400 watt amplifier typically weighs anywhere from 16 kilograms to over 38 kilograms depending upon the design and choice of materials. Such amplifiers normally employ costly components necessitated by the peak loads which they must carry, and generate significant amounts of heat which must be dissipated to avoid component damage.

With regard to the transformer weight problem, an obvious approach would be to reduce the number of windings and/or the gauge of the wire making up the transformer coils. However, reduction in the number of windings also reduces the inductance of the primary coil, thereby increasing idling currents through the coil and contributing to both heat generation and increased power consumption. The conventional method for achieving low idling currents in the primary has been to use a large number of windings. This approach also requires a large number of windings in the secondary to keep the voltage in the secondary at the proper level. The obvious alternative for weight reduction (i.e., reduction of the wire gauge) is not an acceptable solution since the internal resistance of each coil would be increased, leading to excessive heat generation and power loss upon high powered demands being placed on the transformer. Conventional wisdom has thus taught the necessity of increasing the size and weight of the transformer whenever a transformer powered amplifier is redesigned for increased power rating.

SUMMARY OF THE INVENTION

The apparatus of the present invention is for amplifying an audio signal having an amplitude which varies at an audio frequency. It comprises audio amplifier means for amplifying the audio frequency amplitude variations of the audio signal to produce an output signal corresponding to the audio signal. The amplifier means includes an audio signal receiving means for receiving the audio signal and a power receiving means characterized in that said power receiving means requires a power input of a predetermined voltage level for proper operation of the audio amplifier means.

There is power supply means for supplying power to the amplifier means, with the power supply means being adapted to be connected with a source of commercially available, sinusoidally varying supply voltage having a constant frequency within the audio range. The power supply means comprises a transformer having a primary winding and a secondary winding. The secondary winding is operatively connected to the power receiving means of the amplifier means. The primary winding is adapted to be connected to the source of commercially available supply voltage. Half cycles of the sinusoidal supply voltage can be considered as having a first lower voltage portion at the beginning portion of the voltage sine wave half cycle, a second higher voltage portion during a middle portion of the sine wave half cycle, and a third lower voltage portion at an ending portion of the sine wave half cycle. The power supply means is characterized in that the transformer is so arranged, relative to the amplifying means, that with current flowing in the primary and with voltage imposed on the primary during the middle portion of the half cycle, voltage is developed in the secondary winding in excess of the predetermined voltage level required to cause proper operation of the amplifying means.

There is power control means to cause variable amounts of electrical energy to be transmitted to the primary winding of the transformer to induce corresponding variable electrical energy in the secondary winding. The power control means includes switch means connected between the source and the primary winding for operating in a conductive state in response to a control signal for a selected power transmitting portion of said half cycles, to cause the voltage during the power transmitting portion to be applied across the primary winding only when the switch means is in the conductive state.

There is control signal generating means to cause the switch means to be conductive for said power transmitting period during the middle portion of the half cycle, and nonconductive during at least substantial portions of the beginning and ending portions of the half cycle. The control means is such that for higher power requirements of the amplifying means, duration and location of the power transmitting period during which the switch means is conductive are such to deliver greater electrical energy through the transformer to the amplifying means. For lower power requirements of the amplifying means, the duration and location of the power transmitting period are such to deliver lower electrical energy through the transformer to the amplifying means.

In one form, the control means is characterized in that the power delivered to the transformer is controlled by changing location of the power transmitting period between lower and higher voltage portions of the half cycles. In another form, the control means is characterized in that greater or lesser power is delivered through said transformer by modifying duration of the power transmitting period during the middle cycle portion. In yet another form, energy delivered through the transformer is controlled by changing both location and duration of the power transmitting period.

In one embodiment, the switch means is characterized in that it is operative as a switch when current is transmitted through the switch means in a first direction, but not under circumstances where current would be transmitted through the switch means in a second direction. The apparatus further comprises rectifying means to cause alternating current imposed on the primary winding to travel in only the first direction through the switch means. In the preferred form, the switch means comprises transistor means connected in series with the primary winding, and the rectifying means comprises a rectifying bridge operatively connected to the primary winding.

In another embodiment, the switch means comprises first and second switches. The first switch is operatively connected to the primary winding in a manner to be conductive during the power transmitting period when current is flowing through the primary winding in a first direction. The second switch is arranged to be conductive during the transmitting period when current is flowing through the primary winding in a second direction.

In the method of the present invention, the apparatus is provided as described above. The current through the primary winding of the transformer is controlled as described above to supply greater or lesser amounts of electrical energy, in response to the power requirements needed for amplification.

Other features of the present invention will become apparent from the following detailed description.

DESCRIPTION OF THE PREFERRED EMBODIMENTS

Figure 1:
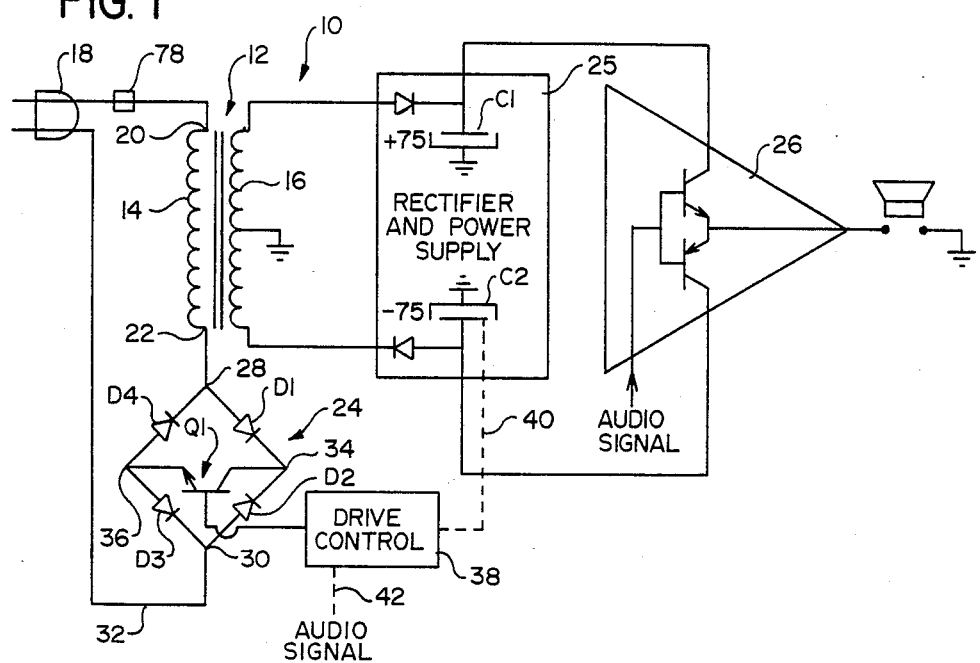
FIG. 1 is a schematic drawing of a first embodiment of the present invention, with the amplifying portion being shown only schematically.

With reference to FIG. 1, the apparatus 10 of the present invention comprises a power supply comprising a transformer 12, having primary and secondary windings 14 and 16, respectively. The primary 14 is connected to a power input 18 (shown in the form of a conventional electrical plug) which is adapted to be connected to a conventional commercially available source of sinusoidally varying alternating current. One end 20 of the primary 14 is connected directly to one terminal of the plug 18, while the other end 22 of the primary 14 is connected to a control circuit 24 which in turn connects to the other terminal of the plug 18.

The secondary winding 16 of the transformer 12 connects to a rectifier and power supply 25, which in turn delivers power to an amplifier 26, these components 25 and 26 being shown in FIG. 1 only schematically. For purposes of the description of the power supply of the present invention, it is necessary at this time only to indicate that the amplifier 26 has a power input which needs to receive its power at a predetermined voltage level or levels, and that the power is supplied at substantially constant voltage levels from the rectifier and power supply 25. Further, the amplifier 26 is adapted to amplify an audio signal which has peak power requirements of relatively short duration and substantially lower power requirements for longer periods of time. In general, in terms of time, the peak power requirements occur during a relatively small percentage of the audio signal being amplified.

The power control circuitry comprises a rectifying bridge made up of four diodes D1–D4. The juncture 28 of diodes D1 and D4 is connected to the point 22 of the primary 14, while the juncture 30 of the diodes D2 and D3 is connected directly to line 32 leading to the power input 18. There is a transistor Q1 connected between the middle points of the rectifying bridge, namely the juncture 34 of the diodes D1 and D2, and the juncture 36 of the diodes D3 and D4. It is readily apparent from the examination of the circuitry 24 that as alternating current flows through the primary winding 14, the path of the current (flowing from positive to negative) always flows in the same direction from point 34 through 36, and thus flows through the transistor Q1 always in the same direction.

Current flow in both directions through the primary winding 14 is controlled by means of the transistor Q1. The control for the transistor Q1 is indicated schematically at 38 as a "drive control". This drive control 38 is or may be of conventional design. For example, it could be a computerized control device, such as Universal Timer 555, commonly called the "Triple Nickel". The input to the drive control 38 is a signal or value related to the power requirements of the amplifier 26. As shown herein, the input is shown as being derived schematically from either or both of two sources. One source, indicated schematically by the dotted line 40, is from a capacitor of the amplifier 26. As is conventional in the prior art, such a capacitor is charged to a predetermined voltage level to supply power to the amplifier 26. When the power requirements of the amplifier 26 are higher, so as to lower the voltage of the capacitor, this voltage drop is sensed to provide a value to indicate that greater power input to the amplifier 26 is needed. Alternatively, if the input is directly from the audio signal (this being indicated schematically at 42), the magnitude of the audio signal itself is the indicator of the power which is to be required by the amplifier 26. As an alternative, a combination of the inputs 40 and 42 could be utilized.

In general, the operation of the drive control 38 is such that the timing and/or duration of the conductive period of the transistor Q1 is controlled to provide greater or less power to be delivered through the transformer 12. The ways in which this can be accomplished will now be described, with references to FIG. 2 and then to FIGS. 3A-3C, 4A-4C and 5A-5C.

Before discussing specifically the manner in which current through the transformer 12 is controlled, it is believed that it would be helpful to discuss generally some of the overall operating features of the apparatus 10. The rectifier and power supply 25 has one or more capacitors which are charged to a predetermined level, and it is these one or more capacitors that provides the power current for the actual amplification. In a lower power, less expensive amplifier, it is common to have only two capacitors, one being positively charged and the other negatively charged, and such an arrangement is shown in FIG. 1 as two capacitors C1 and C2, charged to +75 volts and −75 volts, respectively. In an amplifier such as shown in my co-pending U.S. patent application, Ser. No. 413,876, there can be a plurality of capacitors at stepped voltage levels, with the amplifier being provided with control circuitry to take current from a selected capacitor or capacitors depending upon the power requirements of the amplifier at any particular time. To maintain the capacitor(s) to be charged to an appropriate level, the secondary winding 16 of the power supply 12 must be at a certain minimum voltage level before it is able to transmit current to the capacitor(s), such as at C1 and C2, and thus maintain the capacitor voltage level. On the assumption that the capacitor(s) of the rectifier and power supply 25 is or are maintained at a fairly constant level, this voltage level remains at the same value within reasonably close tolerances.

Figure 2:
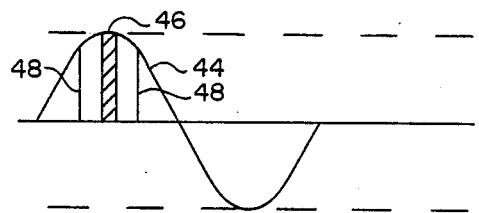
FIG. 2 is a schematic showing of a voltage curve imposed on the primary winding of a transformer of a conventional prior art audio amplifier.

Before discussing the manner in which the power supply 12 of the present invention operates, it would be helpful to analyze at least briefly the manner in which power supplies of conventional amplifiers operate, and this will be discussed with reference to FIG. 2. In FIG. 2, there is shown a sinusoidal curve 44 which is supplied from a conventional 117–125 volt 60 cycle alternating current source. Normally, the supply voltage has a peak voltage input of approximately 169 volts.

A typical audio sound has peak power requirements of relatively short duration and average power requirements of longer duration which are possibly 1/20th of the peak power requirements. Thus, most of the time the amplifier is operating at only 1/10th to 1/20th of full power. When the amplifier is demanding only average power, current flows in the secondary winding for only a very short period of time, and this occurs at the peak of the sine wave of the input voltage. This time period is indicated by the shaded area at 46 of FIG. 2. However, when there are peak power requirements, there is an immediate drain on the storage capacitors of the amplifier to lower their voltage levels slightly, and the result is that the secondary winding is conducting for a longer time period, so that the conducting portion of the sine wave of FIG. 2 is broadened out to, for example, lines indicated at 48. It should be noted that since the two lines 48 are spaced further apart, the voltage produced in the secondary winding is moderately down from the peak voltage delivered at the time period indicated at 46. It should be emphasized that this discussion relates to power supplies of conventional amplifiers.

In designing a conventional transformer, careful consideration must be given to accommodate the idling current in the primary. Idling current is the current which flows in the primary when no current is flowing in the secondary. In a transformer having a small number of windings in the primary and thus a small inductance, the primary idling current may become large enough to cause the transformer to heat up to an undesired extent. Further, it should be noted that the problem of the idling current is at its worst during low power requirements, when power is flowing in the secondary for only a relatively short time. The net effect is that when the transformer performs in the conventional manner in the audio amplifier, the transformer must be made large enough to accommodate these idling currents.

In contrast with a conventional power supply transformer, a transformer designed for use in the duty cycle controlled power supply of the present invention will normally be formed with a higher secondary to primary turns ratio than is conventional in a non-duty cycle controlled transformer employed in prior art amplifier power supply circuits. The effect of this is that the voltages which potentially can be generated in the secondary winding are larger, relative to the voltage level required to charge capacitor(s) of the amplifier to the desired level, and this will be described below, initially with respect to FIGS. 3A–3C.

Figure 3A:
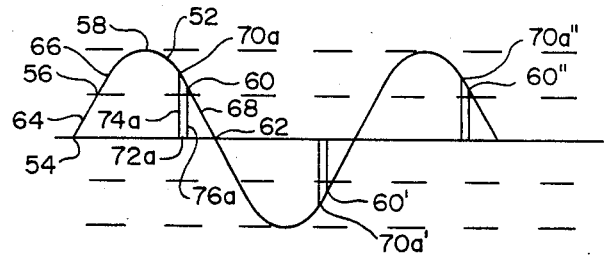
FIGS. 3A, 3B and 3C illustrate various voltage cycle wave forms imposed on the primary winding of the power supply of FIG. 1, according to one form of the present invention.
Figure 3B:
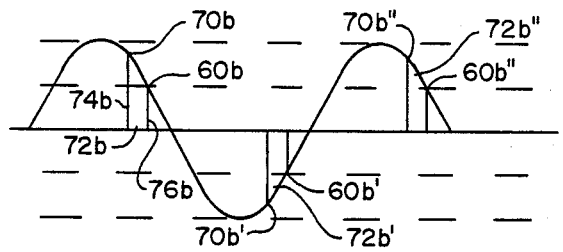
Figure 3C:
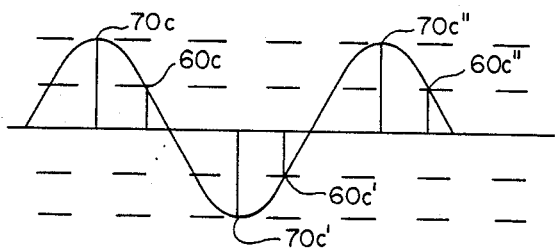

In FIGS. 3A–3C, there is shown a sine wave 52, which represents the voltage imposed on the primary winding 14. For purposes of analysis, this sine wave 52 can be considered as having for each half cycle a starting point 54 at which the voltage is at zero level and begins climbing to a higher power level. There is an intermediate voltage point 56 in the first portion of the half cycle, a peak voltage at 58, a second intermediate voltage level 60 in the latter half of the half cycle, and finally an end point 62 where the voltage goes back to the zero level. The voltage portion 64 between the points 54 and 56 can be considered the first lower voltage beginning portion of the sine wave. That portion of the sine wave extending between points 56 and 60 and passing through the peak at 58, can be considered the second higher power middle portion of the sine wave, and this is designated 66. Finally, there is a third ending lower voltage portion 68, which is located between the points 60 and 62.

In the present discussion, the change over points 56 and 60 are presumed to be at voltage levels at which the transformer 12 would be able, with current flowing through the primary 14, to generate a voltage in the secondary winding 16 which is equal to the voltage level at which the capacitor(s) of the power supply 25 are charged for proper operation of the amplifier. To take a simplified example, let it be assumed that the power supply 25 has only the two capacitors C1 and C2 charged to +75 volts and −75 volts, respectively. If at point 56 on the sine wave 52 current begins flowing through the primary winding 12, exactly 75 volts would be produced over the secondary winding 16. As the voltage climbs upwardly from point 56 toward point 58, obviously greater voltage would be developed in the secondary winding 16, causing yet greater current to flow in the secondary winding 16, as well as in the primary winding 14. As the voltage drops to point 60, any current which would then flow through the primary winding 14 (i.e. that current flowing in the voltage way portion 68) would not be sufficient to generate sufficient voltage in the secondary winding 16 to cause current to flow in the secondary 16 to charge the capacitors of the amplifier 26.

With the foregoing in mind, let us now examine the operation of the control circuitry 24 in the present invention. There are three different modes of operation illustrated, with the first being shown in FIGS. 3A-3C, the second in FIGS. 4A-4C, and the third in FIGS. 5A-5C.

In the first mode of operation (shown in FIGS. 3A-3C), the drive control 38 is arranged so that the transistor Q1 becomes conductive at a point 70 in the middle high power voltage curve portion 66, with this point 70 being variable, depending upon the power requirements of the transformer 26. Further, the drive control 38 functions to cause the transistor Q1 to be nonconductive at point 60, which is the transition point from the middle higher voltage portion 66 to the trailing lower voltage portion 68. For the lower power requirements, which occur during most of the time for an audio signal, the turn-on point (indicated at 70a in FIG. 3A) is just slightly before the shut-off point 60. Thus, current flows through the primary 14 only during that very short time period during which the voltage travels from point 70 downward to point 60. This period, which is called the "power transmitting period", is indicated as that area 72a between lines 74a and 76a. The other conducting periods are shown at 70a'-60' and 70a" and 60" for the next two half cycles.

When the audio signal is of greater amplitude so that there are higher power requirements for the amplifier 26, the drive control 38 reacts to cause the turn-on point 70 for the transistor Q1 to move to an earlier time in the half cycle, this being indicated at 70b, 70b' and 70b" in FIG. 3B, with the shut-off points continuing to be at the same location, indicated at 60b, 60b' and 60b". Thus, the power transmitting period, indicated by lines 74b and 76b in FIG. 2 is of greater duration. Further, the initial portion of the power transmitting period is at a relatively higher voltage level, causing yet greater power to be delivered through the transformer 12.

Finally, with reference to FIG. 3C, there is a condition where full power is being delivered to the amplifier 26. In this state, the turn-on point 70c has been moved to an area closely adjacent to the peak voltage point 58. It is to be understood that the wire size, transformer, core size, number of windings, and ratio of windings are such that the transformer 12 can handle quite adequately the power requirements for the low power mode of operation, as illustrated in FIG. 3A, without overheating. Further, these same transformer perameters are arranged so that it can handle for a short period of time the peak power requirements, as illustrated in FIG. 3C, without the transformer core saturating, or at least not saturating to any great extent. However, if the transformer 12, in its optimized configuration for operation of the present invention, were required to handle the peak power requirements at a steady state, the transformer 12 would soon overheat and become damaged. (However, before the transformer 12 would be permanently damaged, it would trigger a shut-off mechanism to stop power being delivered to the primary 14. Such a shut-off mechanism is shown somewhat schematically at 78 in FIG. 1.)

Further, relative to the operating characteristics of the transformer in accordance with the mode of operation illustrated in FIGS. 3A-3C, during that portion of the half cycle which is prior to the transistor turn-on point 70, there is no idling current in the primary winding 14. Likewise, after the shut-off point 60, there is no idling current. The effect of this is that the number of turns in the primary can be reduced substantially, since the primary 14 does not require a great deal of inductive reactance to eliminate excessive current.

A second mode of operation of the apparatus of FIG. 1 will now be described with reference to FIGS. 4A-4C. In this second mode of operation, the length of the power transmitting period remains substantially the same for low power, intermediate power, and full power operation. However, the timing of the power transmitting period is changed so that for the low powered transmitting period, the shut-off point is very close to the change over point 60. For higher power requirements, the power transmitting period is moved further rearwardly (i.e. toward the peak power point 58), while for full power, the power transmitting period is at the location of the peak power point 58.

Figure 4A:
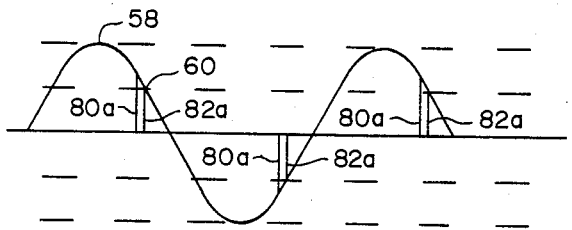
FIGS. 4A, 4B and 4C illustrate voltage cycle wave forms imposed on the primary winding of the power supply of FIG. 1, with a modified form of the control apparatus of the first embodiment.
Figure 4B:
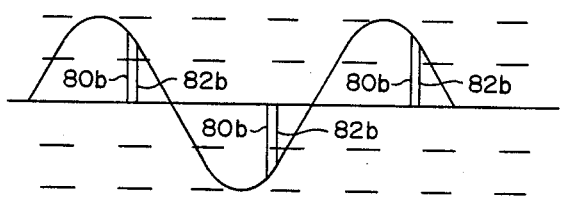
Figure 4C:
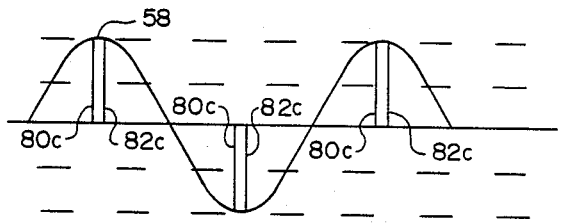

This is illustrated in FIGS. 4A-4C, where the turn-on point is illustrated at 80, and the turn-off point at 82. In FIGS. 4A, 4B and 4C, these points 80 and 82 are designated by the suffixes "a", "b", and "c". It can be seen from an examination of FIGS. 4A-4C that the distance between the lines 80 and 82 remains substantially the same, but that the power transmitting period moves toward higher voltage levels in the half cycle as more power is required. Further, since the transistor Q1 is nonconductive both prior to and after the times indicated at 80 and 82, there is no idling current during those shut-off periods, so that the windings of the transformer 12 can be greatly reduced, relative to prior art power supplies.

Figure 5A:
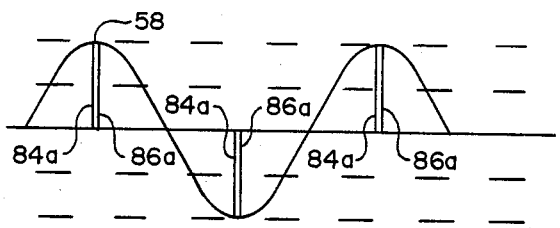
FIGS. 5A, 5B and 5C show yet three other cycle wave forms imposed on the primary winding, in accordance with yet another modification of the control apparatus.
Figure 5B:
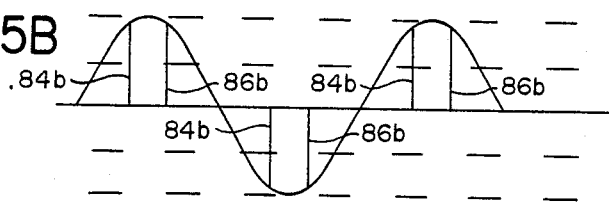
Figure 5C:
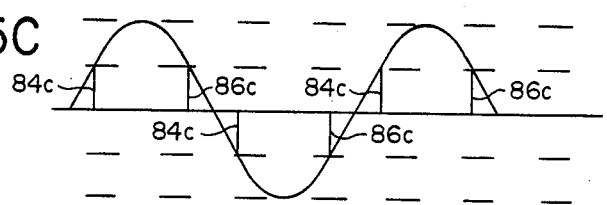

A third method of operation of the present invention is illustrated in FIGS. 5A-5C. The turn-on and turn-off points for the transistor Q1 are illustrated by lines 84 and 86, respectively. In FIG. 5A, these are designated 84a and 86a; in 5B they are designated 84b and 86b; and in FIG. 5C, they are designated 84c and 86c. It can be seen in FIG. 5A that the power transmitting period between lines 84a and 86a is of very short duration, but occurs at the peak voltage point 58. Thus, even though the power delivered is at a very high level, it is for such a short duration of time that the power delivered relative to the entire half cycle is at the lower average power level.

For intermediate power requirements, as illustrated in FIG. 5B, the turn-on point 84b is moved further forward in the half cycle, while the turn-off point 86b is moved further rearwardly in the half cycle, so that current is delivered at high power for a somewhat longer duration. Finally, in FIG. 5C, the turn-on and turn-off points 84c and 86c have moved outwardly to their extreme positions so that relative to average power for the full half cycle, there is delivery of full power.

Present analysis indicates that the operating modes shown with reference to FIGS. 3A-3C and FIGS. 4A-4C are preferred over the mode shown in FIGS. 5A-5C. However, the operating mode of FIGS. 5A-5C is shown as one possible mode which may have certain features that would make this mode (or variations thereof) desirable for certain situations. Further, it is to be understood that the operating characteristics of the three modes shown could conceivably be combined in some manner to incorporate desirable features of each. For example, while the mode in FIGS. 3A-3C has a constant shut-off point at 60, and while the mode of FIGS. 4A-4C has a constant duration for the power transmitting period with the shut-off point changing, it would be possible to combine features of each, in that the location of the shut-off point may vary with the duration of the power transmitting period also changing.

Figure 6:
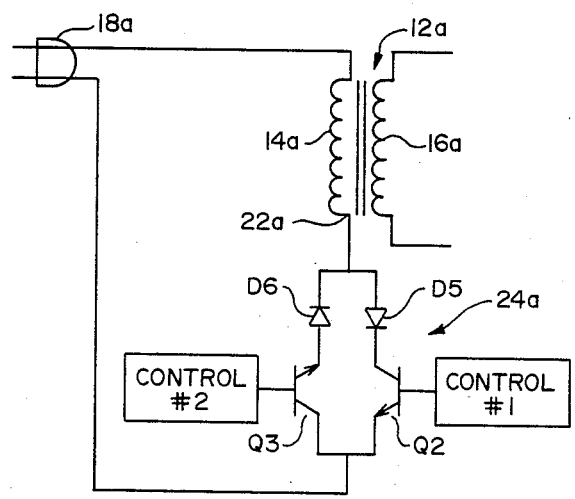
FIG. 6 shows a second embodiment of the control switching mechanism of the present invention.

A second embodiment of the present invention is shown in FIG. 6. Components of this second embodiment which are similar to components of the first embodiment will be given like numerical designations, with an "a" suffix distinguishing those of the second embodiment. For ease of illustration, the rectifier and power supply are not shown. Thus, there is a power supply in the form of a transformer 12a, having primary and secondary windings 14a and 16a, respectively. The power inlet is indicated at 18a. The control circuitry 24 comprises two transistors Q2 and Q3 connected in parallel, between the lower point 22a of the primary winding 14a and the lower line of the power input 18a. There are provided in series with each of the transistors Q2 and Q3 diodes D5 and D6, respectively, with these diodes D5 and D6 being arranged to permit the current to flow only in the proper directions through the transistors Q2 and Q3. Thus, on every other half cycle, with current flowing through the primary 14a in one direction, the current flows through Q2, while in the other half cycles, with the current flowing in the opposite direction, the flow is through transistor Q3.

There are two control units, designated "control 1" and "control 2", respectively, and these are operated in substantially the same manner as described in the previous embodiment, it being understood, of course, that these control units would operate only on the half cycle during which current would be flowing through its related transistor, either Q2 or Q3.

Within the broader scope of the present invention, it is to be understood that while transistors have been shown in the embodiments of FIGS. 1 and 6 as the switching device, it would of course to be possible to use other suitable switching devices which can be switched off in the situations described herein. In terms of the relative merits between the embodiments of FIGS. 1 and 6, the transistors are required in both embodiments to handle very high currents for brief periods of time. Accordingly, relatively expensive transistors are required. For this reason, in terms of initial cost, the arrangement of FIG. 1 is preferred, since only one switching transistor Q1 is required. However, in the arrangement of FIG. 1, the current experiences three small voltage drops (i.e. through two diodes and one transistor Q1), while in the arrangement of FIG. 6, there is a voltage drop only through two components (i.e. one transistor Q2 or Q3 and one diode D5 or D6). Therefore, as a general rule, the arrangement of FIG. 1 would be preferred, since the additional voltage drop is, relative to overall operating efficiency and power costs, rather minor.

It is apparent that various modifications could be made to the present invention without departing from the basic teachings thereof.

I claim:

1. An apparatus for amplifying an audio signal having an amplitude which varies at an audio frequency, said apparatus comprising:

a. audio amplifier means for amplifying audio frequency amplitude variations of the audio signal to produce an output signal corresponding to the audio signal, said amplifier means including an audio signal receiving means for receiving the audio signal and a power receiving means characterized in that said power receiving means requires a power input of a predetermined voltage level for proper operation of the audio amplifier means;

b. power supply means for supplying power to the amplifier means, said power supply means adapted to be connected with a source of commercially available, sinusoidally varying supply voltage having a constant frequency within the audio range, said power supply means comprising a transformer having a primary winding and a secondary winding, said secondary winding being operatively connected to the power receiving means of the amplifier means, said primary winding being adapted to be connected to said source, where half cycles of said sinusoidal supply voltage having a first lower voltage portion at a beginning portion of the voltage sine wave half cycle, a second higher voltage portion during a middle portion of said sine wave half cycle, and a third lower voltage portion at an ending portion of the sine wave half cycle, said power supply means being characterized in that said transformer is so arranged, relative to the amplifying means, that with current flowing in the primary and with voltage imposed on the primary during the middle portion of the half cycle, voltage is developed in the secondary winding in excess of the predetermined voltage level required to cause proper operation of the amplifying means;

c. power control means to cause variable amounts of electrical energy to be transmitted to the primary winding of the transformer to induce corresponding variable electrical energy in the secondary winding, said power control means including switch means connected between said source and said primary winding for operating in a conductive state in response to a control signal for a selected power transmitting portion of said half cycles, to cause the voltage during the power transmitting portion to be applied across the primary winding only when the switch means is in the conductive state;

d. control signal generating means to cause said switch means to be conductive for said power transmitting period during the middle portion of the half cycle, and nonconductive during at least substantial portions of the beginning and ending portions of the half cycle, said control means being such that for higher power requirements of the amplifying means, duration and location of the power transmitting period during which the switch means is conductive are such to deliver greater electrical energy through the transformer to the amplifying means, and for lower power requirements of the amplifying means the duration and location of the power transmitting period are such to deliver lower electrical energy through the transformer to the amplifying means.

2. The apparatus as recited in claim 1, wherein said control means is characterized in that the power that is delivered to the transformer is controlled by changing location of the power transmitting period between lower and higher voltage portions of said half cycles.

3. The apparatus as recited in claim 2, wherein said control means is characterized in that greater or lesser power is delivered through said transformer by modifying duration of power transmitting period during the middle cycle portion.

4. The apparatus as recited in claim 1, wherein said control means is characterized in that the energy delivered through the transformer is controlled by changing both location and duration of the power transmitting period.

5. The apparatus as recited in claim 1, wherein said switch means is characterized in that it is operative as a switch when current is transmitted through the switch means in a first direction, but not under circumstances where current would be transmitted through said switch means in a second direction, said apparatus further comprising rectifying means to cause alternating current imposed on said primary winding to travel in only the first direction through the switch means.

6. The apparatus as recited in claim 5, wherein said switch means comprises transistor means operatively connected in series with said primary winding.

7. The apparatus as recited in claim 6, wherein said rectifying means comprises a rectifying bridge operatively connected to the primary winding, said switch means being connected across said bridge.

8. The apparatus as recited in claim 5, wherein said rectifying means comprises a rectifying bridge operatively connected to the primary winding, said switch means being connected across said bridge.

9. The apparatus as recited in claim 1, wherein said switch means comprises first and second switches, said first switch being operatively connected to said primary winding in a manner to be conductive during the power transmitting period when current is flowing through the primary winding in a first direction, said second switch being arranged to be conductive during the transmitting period when current is flowing through the primary winding in a second direction.

10. The apparatus as recited in claim 9, wherein said first and second switches comprise first and second transistor means connected in parallel.

11. The apparatus as recited in claim 1, wherein said control signal generating means is characterized in that said switch means is caused to be conductive at variable time periods during the second higher voltage portion of the half cycle, and said switch means is caused to be nonconductive at a location proximate where the second higher voltage portion is adjacent to a location where one of said first and third lower voltage portions is adjacent to said second middle voltage portion.

12. The apparatus as recited in claim 1, wherein said control signal generating means is characterized in that when there are lower power requirements of the amplifying means, the switch means is caused to be nonconductive at a location proximate a location adjacent to a location where one of said first and third lower voltage portions is adjacent to said second middle voltage portion, and when there are higher power requirements of the amplifying means, the switch means is caused to be conductive and nonconductive at higher power locations in the middle voltage portion, and further from locations where the first and third lower voltage portions are adjacent to the second middle voltage portion.

13. A method for amplifying an audio signal having an amplitude which varies at an audio frequency, said method comprising:
   a. receiving the audio signal and amplifying audio frequency amplitude variations of the audio signal to produce an output signal corresponding to the audio signal;
   b. supplying power for amplifying the audio signal through power receiving means characterized in that said power receiving means requires a power input of a predetermined voltage level for proper amplification;
   c. supplying power to the power receiving from power supply means connected with a source of commercially available, sinusoidally varying supply voltage having a constant frequency within the audio range, said power supply means comprising a transformer having a primary winding and a secondary winding, said secondary winding being operatively connected to the power receiving means of the amplifier means, said primary winding being adapted to be connected to said source, where half cycles of said sinusoidal supply voltage having a first lower voltage portion at a beginning portion of the voltage sine wave half cycle, a second higher voltage portion during a middle portion of said sine wave half cycle, and a third lower voltage portion at an ending portion of the sine wave half cycle, said power supply means being characterized in that said transformer is so arranged, relative to the amplifying means, that with current flowing in the primary and with voltage imposed on the primary during the middle portion of the half cycle, voltage is developed in the secondary winding in excess of the predetermined voltage level required to cause proper operation of the amplifying means;
   d. providing power control means to cause variable amounts of electrical energy to be transmitted to the primary winding of the transformer to induce corresponding variable electrical energy in the secondary winding, said power control means including switch means connected between said source and said primary winding for operating in a conductive state in response to a control signal for a selected power transmitting portion of said half cycles, to cause the voltage during the power transmitting portion to be applied across the primary winding only when the switch means is in the conductive state;
   e. generating control signals to cause said switch means to be conductive for said power transmitting period during the middle portion of the half cycle, and nonconductive during at least substantial portions of the beginning and ending portions of the half cycle in a manner that for higher power requirements of the amplifying means, duration and location of the power transmitting period during which the switch means is conductive are such to deliver greater electrical energy through the transformer to the amplifying means, and for lower power requirements of the amplifying means the duration and location of the power transmitting period are such to deliver lower electrical energy through the transformer to the amplifying means.

14. The method as recited in claim 13, wherein power that is delivered to the transformer is controlled by changing location of the power transmitting period between lower and higher voltage portions of said half cycles.

15. The method as recited in claim 14, wherein greater or lesser power is delivered through said transformer by modifying duration of power transmitting period during the middle cycle portion.

16. The method as recited in claim 13, wherein energy delivered through the transformer is controlled by changing both location and duration of the power transmitting period.

17. The method as recited in claim 13, wherein said switch means is characterized in that it is operative as a switch when current is transmitted through the switch means in a first direction, but not under circumstances where current would be transmitted through said switch means in a second direction, said method further comprising directing alternating current through the transformer primary winding through rectifying means to cause the alternating current to travel in only the first direction through the switch means.

18. The method as recited in claim 17, wherein said switch means comprises transistor means operatively connected in series with said primary winding.

19. The method as recited in claim 17, wherein said rectifying means comprises a rectifying bridge operatively connected to the primary winding, with said switch means being connected across said bridge.

20. The method as recited in claim 13, wherein said switch means comprises first and second switches, said first switch being operatively connected to said primary winding in a manner to be conductive during the power transmitting period when current is flowing through the primary winding in a first direction, said second switch being arranged to be conductive during the transmitting period when current is flowing through the primary winding in a second direction.

* * * * *